(12) United States Patent
Wang et al.

(10) Patent No.: US 11,886,115 B1
(45) Date of Patent: Jan. 30, 2024

(54) RESIN, POSITIVE PHOTOSENSITIVE RESIN COMPOSITION AND USE

(71) Applicant: YANTAI SUNERA LLC, Yantai (CN)

(72) Inventors: Zhiguo Wang, Yantai (CN); Xuesong Jiang, Yantai (CN); Guangqiang Shao, Yantai (CN); Xinyu Qiu, Yantai (CN); Hongyin Dai, Yantai (CN); Baohua Hu, Yantai (CN)

(73) Assignee: YANTAI SUNERA LLC, Yantai (CN)

( * ) Notice: Subject to any disclaimer, the term of this patent is extended or adjusted under 35 U.S.C. 154(b) by 10 days.

(21) Appl. No.: 18/299,687

(22) Filed: Apr. 12, 2023

(51) Int. Cl.
*G03F 7/023* (2006.01)
*G03F 7/022* (2006.01)
*G03F 7/039* (2006.01)
*G03F 7/004* (2006.01)

(52) U.S. Cl.
CPC .......... *G03F 7/0233* (2013.01); *G03F 7/0048* (2013.01); *G03F 7/022* (2013.01); *G03F 7/0226* (2013.01); *G03F 7/039* (2013.01)

(58) Field of Classification Search
CPC ......... G03F 7/0233; G03F 7/30; G03F 7/0226
See application file for complete search history.

(56) References Cited

U.S. PATENT DOCUMENTS

| | | | |
|---|---|---|---|
| 6,001,517 A * | 12/1999 | Kawamonzen | ....... G03F 7/0045 430/326 |
| 8,513,350 B2 | 8/2013 | Kimura | |
| 9,023,559 B2 | 5/2015 | Lee et al. | |
| 9,329,475 B2 | 5/2016 | Namgung et al. | |
| 2004/0053156 A1 * | 3/2004 | Fujita | .................... G03F 7/0048 430/326 |

FOREIGN PATENT DOCUMENTS

| | | |
|---|---|---|
| CN | 103788371 A | 5/2014 |
| CN | 109370614 A | 2/2019 |
| CN | 114634429 A | 6/2022 |
| JP | 2011053315 A | 3/2011 |

\* cited by examiner

*Primary Examiner* — John S Chu
(74) *Attorney, Agent, or Firm* — True Shepherd LLC; Andrew C. Cheng (57) ABSTRACT

A positive photosensitive resin composition comprises a resin, a diazonaphthoquinone compound and a solvent. The resin comprises a combination of any one or more of polyamic acid, polyamic ester and polyimide of a segment shown in the following structure;

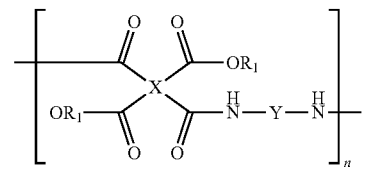

. The resin film formed by the positive photosensitive resin composition is applied to a semiconductor passivation film, a semiconductor element protective film, an insulating layer of an organic electroluminescent element, a flat film of a thin film transistor (TFT) substrate, a wiring protective insulating film of a circuit board and a flat film for displays and solid camera elements. The photosensitive resin film formed by the positive photosensitive resin composition has the characteristics of low shrinking rate and excellent heat resistance and resolving power, and has good application effect in electronic elements.

7 Claims, 2 Drawing Sheets

RESIN, POSITIVE PHOTOSENSITIVE RESIN COMPOSITION AND USE

CROSS-REFERENCE TO RELATED APPLICATIONS

This application claims priority to Chinese Patent Application No. 202210941131.4 with a filing date of Aug. 8, 2022. The content of the aforementioned application, including any intervening amendments thereto, is incorporated herein by reference.

TECHNICAL FIELD

The present disclosure relates to a resin, a positive photosensitive resin composition and use, belonging to the technical field of photosensitive resins.

BACKGROUND

A cured film obtained by curing a photosensitive resin composition containing polyimide and polyphenyloxazole is widely applied to insulating films of semiconductor elements and insulating films, protective films and flat films of display devices, especially in display devices, for example in insulating layers of organicelectroluminescent (EL) displays and black matrixes of liquid crystal displays.

Polyimide is favored by researchers due to its excellent mechanical property, thermal stability and excellent drug tolerance. A positive photosensitive resin formed by mixing polyamic acid with a diazonaphthoquinone compound as a dissolution inhibitor uses an alkaline water as a developing solution to easily obtain a high-resolution pattern, which is environmental-friendly and is in seamless connection with the existing equipment. To make a polymer more easily dissolved into the alkaline developing solution, researchers introduce a phenolic hydroxyl group on a main chain and a terminating agent is used to control a polymerization degree. These measures can cause reduced in heat resistance and solvent resisting performance, so as to introduce a cross-linking agent and a double-bond group, however, this leads to increase in shrinkage rate.

SUMMARY

In view of the defects in the prior art, the present disclosure provides a resin, a positive photosensitive composition and use. A photosensitive film formed by the positive photosensitive composition has the characteristics of low shrinkage rate and excellent heat resistance and resolving power, and has good application effect in electronic elements.

In order to solve the above technical problems, provided is the following technical solution: a resin, the resin being a combination of any one or more of polyamic acid, polyamic ester and polyimide of a segment shown in formula (1);

Formula (1)

where X represents a tetravalent organic group constituting tetracarboxylic acid or derivatives thereof; $R_1$ is a hydrogen atom or a C1-10 organic group constituting tetracarboxylic acid derivatives;

Y represents a bivalent organic group constituting the resin, and at least comprises a general structure formula (2):

Formula (2)

in the formula (2), Y1 is any one of and and * represents a linkage position.

R2 in the formula (2) is selected from one of —NHCO— or —O—;

n in the formula (1) is an integer of 10-100000.

Further, the organic group in the formula (2) is derived from one or more of the following diamine b-1-1 to b-1-8:

b-1-1

-continued b-1-2 b-1-3 b-1-4 b-1-5 b-1-6 b-1-7 b-1-8

Further, at least one tail end in the formula (1) has a terminated structure of formula (3) or formula (4):

Formula (3)

Formula (4)

in the formula (3), M is derived from a monoamine group which is selected from aniline, n-butylamine, n-pentamine, n-hexanamine, n-heptylamine, n-octylamine, 2-aminothiazole, aminoquinoline, p-aminophenol, and 3-aminophenol; in the formula (4), L is derived from monoanhydride group which is selected from maleic anhydride, naphthalene dicarboxylic anhydride, phthalic anhydride or cyclopentane dicarboxylic anhydride.

Further, the formula (1) further comprises a diamine residue except formula (2), the diamine residue is derived from a combination of one or more of the following diamine monomers: p-phenylenediamine, m-phenylenediamine, 3-carboxyl-m-phenylenediamine, 4,4'-diaminodiphenyl ether, 3,4-diaminodiphenyl ether, 3,4-diaminodiphenyl sulfone, 4,4'-diaminodiphenyl sulfone, 3,4-diaminodiphenyl sulfide, 4,4'-diaminodiphenyl sulfide, 1,4-di(4-aminophenoxy) benzene, di(4-aminophenoxy phenyl) sulfone, di (3-aminophenoxy phenyl) sulfone, 1,4-di(4-aminophenoxy) benzene, bis(3-amino-4-hydroxy) biphenyl, 3,4'-diaminodiphenylmethane, 4,4'-diaminodiphenylmethane, 3,3'-dimethyl-4,4'-diaminobiphenyl, 2,2'-dimethyl-4,4'-diaminobiphenyl, 2,2'-bis(trifluoromethyl)-4,4'-diaminobiphenyl, 2,2,3,3'-tetramethyl-4,4'-diaminobiphenyl, 3,3',4,4'-tetramethyl-4,4'-diaminobiphenyl, 2,2'-bis[3-(4-amino-benzamido)-4-hydroxyphenyl] hexafluoropropane and 3,3'-dihydroxy bis [4-(4-amino-benzamido)] biphenyl.

Further, the tetracarboxylic acid residuerepresented by X in the formula (1) is derived from a combination of one or more of the following dianhydride monomers: pyromellitic dianhydride, 3,3',4,4'-biphenyltetracarboxylic dianhydride, 3,3',4,4'-diphenylether tetracarboxylic dianhydride, 3,3',4,4'-diphenylsulfone tetracarboxylic dianhydride, 3,3',4,4'-benzophenone tetracarboxylic dianhydride, 2,2-bis(3,4-dicarboxyphenyl) hexafluoroisopropylidene dianhydride, 1,2,3,4-cyclobutane tetracarboxylic dianhydride, 1,2-dimethyl-1,2,3,4-cyclobutane tetracarboxylic dianhydride, 1,2,3,4-tetramethyl-1,2,4-tetramethyl-1,2,4-tetramethyl-1,2,4-tetracarboxylic dianhydride 3,4-cyclobutane tetracarboxylic dianhydride 1,2,3,4-cyclopentane tetracarboxylic dianhydride, 1,2,4,5-cyclohexane tetracarboxylic dianhydride, 3,4-dicarboxy-1,2,3,4-tetrahydroxy-1-naphthalenesuccinic dianhydride, 5-(2,5-dioxothetrahydrofuranyl)-3-methyl-3-cyclohexene-1,2-dicarboxylic dianhydride, 2,3,5-tricarboxy-2-cyclopentane acetic dianhydride, bicyclic[2.2.2]oct-7-en-2,3,5,6-tetracarboxylic dianhydride, 2,3,4,5-tetrahydrofuran tetracarboxylic dianhydride and 3,5,6-tricarboxyl-2-norbornene acetic dianhydride.

Further, the carboxyl group in the formula (1) reacts with an adjacent amide group to be imidized, and an imidization rate is 1%-40%.

A method for preparing the resin as polyimide comprises the following steps: a mixture comprising a dianhydride, a diamine and a terminating agent is dissolved into a solvent and polymerized for 1-24 h at the temperature of 0-100° C. so as to obtain a polyamic acid solution after the reaction is completed, the diazonaphthoquinone compound is directly added into the polyamic acid solution to prepare the positive photosensitive resin composition. Also, the solvent is evaporated at reduced pressure to obtain a polyamic acid solid, or the polyamic acid solution is poured into a large amount of poor solvents, and precipitates are dried to be used. The weight ratio of the resin to the solvent is 1: (5:80). The solvent is a mixture of one or more of N-methyl-2-pyrrolidone γ-butyrolactone, N,N'-dimethylacetamide, N,N'-dimethylformamide, ethylene glycol monomethyl ether, ethylene glycol monoethyl ether, ethylene glycol monobutyl ether, ethylene glycol monoethyl ether, ethylene glycol dimethyl ether and diethylene glycol monomethyl ether.

A method for preparing the resin as polyamic ester comprises: a polyamic acid solution is heated in the presence of an esterification reagent. During the process, the cayboxylic functional group in polyamic acid is converted into a carboxylic ester group through esterification reaction. The esterification reaction is carried out by further reacting in the above polyamic acid solution.

Where, the esterification rate of polyamic acid is 1-100%; the temperature of the esterification reaction is 0-100° C., reaction time is 1-120 hours; the esterification reagent can be alcohol compounds such as methanol and ethanol, or can be acetal compounds such as DMFDMA and DMFDEA, and a molar ratio of the polyamic acid to the esterification reagent is 1:1-10. After the esterification is completed, the reaction system is poured into a large amount of poor solvents to be precipitated, and the precipitates are filtered and dried for use.

A method for preparing the resin as polyimide comprises: the polyamic acid obtained by the above method is heated in the presence of a catalyst (the catalyst is generally acetic anhydride added with triethylamine or pyridine as an acid binding agent. During the process, the amic acid functional group in the polyamic acid is converted into an imide group through imidization reaction. The imidization reaction is carried out through further reaction in the above polyamic acid solution.

Where, the imidization rate of amic acid is 1-80%; the temperature of the imidization reaction is 0-200° C., and the reaction time is 1-120 h. After imidization is completed, the reaction system is poured into a large amount of poor solvents, and the precipitates are filtered and dried for use.

Preferably, the imidization rate of the amic acid is 1-40%. The temperature of the imidization reaction is 20-60° C., and the reaction time is 2-30 h.

The present disclosure further discloses a positive photosensitive resin composition, the positive photosensitive resin composition comprising the resin, a diazonaphthoquinone compound and a solvent.

A weight ratio of the resin to the solvent is 1: (5-80); a weight ratio of the resin to the diazonaphthoquinone compound is 100: (1-100), in this ratio, mechanical properties such as high sensitivity and maintenance of the elongation of the cured resin pattern can be realized.

Preferably, the weight ratio of the resin to the diazonaphthoquinone compound is 100: (3-60); more preferably, the weight ratio of the resin to the diazonaphthoquinone compound is 100: (3-30), thereby realizing higher sensitivity but not damaging the mechanical characteristics of the cured resin pattern.

Further, thediazonaphthoquinone compound is a 1,2-naphthaloquino-2-diazo-4-sulfonic acid ester compound or a 1,2-naphthaloquino-2-diazo-5-sulfonic acid ester compound; the esterification parent of the 1,2-naphthaloquino-2-diazo-4-sulfonic acid ester compound or the 1,2-naphthaloquino-2-diazo-5-sulfonic acid ester compound is a low-molecular-weight polyphenol compound.

Two or more diazonaphthoquinone compounds can be used, and therefore a dissolution rate ratio of an exposed portion and an unexposed portion can be further increased, and then the positive photosensitive resin composition with high sensitivity can be obtained.

Further, the diazonaphthoquinone compound refer to a sulfonic acid ester compound formed by naphthoquinone diazosulfonyl chloride and low-molecular-weight polyphenols; the naphthoquinone diazosulfonyl chloride is selected from a mixture of any one or two of 1,2-naphthoquinone 2-diazo-4-sulfonyl chloride and 1,2-naphthoquinone 2-diazo-5-sulfonyl chloride. The structural formula of 1,2-naphthoquinone 2-diazo-4-sulfonyl chloride and 1,2-naphthoquinone 2-diazo-5-sulfonyl chloride is as follows:

The low-molecular-weight polyphenol compound is selected from a mixture of any one or more of bisphenol A, triphenol A, 4,4'-isopropylidene diphenol, 1,1'-bis(hydroxyphenyl) cyclohexane, 4,4'-dihydroxyphenyl sulfone, 4,4-hexafluoroisopropylidene diphenol, 4,4',4''-trihydroxytriphenylmethane, 1,1',1''-tris(hydroxyphenyl) ethane, 4,4'-[1-[4-[1-(4-hydroxyphenyl) 1-methylethyl]phenyl] ethylenebisphenol, 3,4,5-trihydroxybenzoate methyl ester, 3,4,5-trihydroxybenzoate propyl ester Isoamyl 3,4,5-trihydroxybenzoate, 2-ethylbutyl 3,4,5-trihydroxybenzoate, 2,4-dihydroxybenzophenone, 2,3,4-trihydroxybenzophenone, 2,2'4,4'-tetrahydroxybenzophenone, 2,3,4,4'-tetrahydroxybenzophenone, 2,3,4,4'-tetrahydroxybenzophenone, 2,3,4,4'-tetrahydroxybenzophenone and 2,3,4,2'4'-pentahydroxybenzophenone.

Further, the solvent is a mixture of one or more of N-methyl-2-pyrrolidone γ-Butyrolactone, N,N-dimethyl acetamide, N,N-dimethylformamide, ethylene glycol monomethyl ether, ethylene glycol monoethyl ether, ethylene glycol monobutyl ether, ethylene glycol monoethyl ether, ethylene glycol dimethyl ether and diethylene glycol monomethyl ether ethyl ester.

The positive photosensitive resin composition comprises a cross-linking agent which is selected from a mixture of one or two of the following compounds, but not limited thereto:

-continued

The positive photosensitive resin composition of the present disclosure can contain a compound having an alkoxymethyl group. Since the alkoxymethyl group is subject to cross-linking reaction at a temperature zone of more than 150° C., a cured film with excellent mechanical characteristics can be obtained by heating treatment subsequent to developing, preferably a compound containing more than 2 alkoxymethyl groups, more preferably a compound containing more than 4 alkoxymethyl groups.

Further, according to actual demands, to increase the coating performance of the positive photosensitive resin composition and a substrate, the positive photosensitive resin composition can also comprise a surfactant, an ester compound, an alcohol compound, a ketone compound and an ether compound. The ester compound includes but is not limited to ethyl lactate and propylene glycol monomethyl ether acetate; the alcohol compound includes but is not limited to ethanol; the ketone compound includes but is not limited to cyclohexanone methyl isobutyl ketone; the ether compound includes but is not limited to tetrahydrofuran and dioxane.

Still further, to improve the bonding property of the positive photosensitive resin composition and a substrate such as a silicon substrate, a silane coupling agent, a chelating agent and other agents can be added in the positive photosensitive resin composition, or the substrate is pretreated with the silane coupling agent, hexamethyldisilane (HMDS) and the chelating agent.

The silane coupling agent includes but is not limited to methacryloxydimethoxysilane and 3-aminopropyltrimethoxysilane; the chelating agent includes but is not limited to a titanium chelating agent and an aluminum chelating agent. The addition amount of the silane coupling agent or the chelating agent is 0.5-10% of the weight of the resin.

When the substrate is treated, the coupling agent or the chelating agent together with an organic solvent is prepared into a 0.5 wt %-20 wt % solution, and the organic solvent is selected from a combination of one or more of isopropanol, ethanol, methanol, water, tetrahydrofuran, propylene glycol monomethyl ether acetate, propylene glycol monomethyl ether, ethyl lactate and diethyl adipate; the solvent is used to undergo surface treatment on the substrate by virtue of rotary coating, immersing, spraying, steam treatment and other methods. Then, the substrate reacts with the coupling agent or the chelating agent at 50° C-300° C.

Next, the method of forming a resin pattern using the positive photosensitive composition of the present disclosure will be described.

The positive photosensitive resin composition is coated onto the substrate, the substrate is any one of a silicon plate, ceramics, gallium arsenide, soda lime glass and quartz glass, but is not limited thereto. The coating method is as follows: rotary coating, spraying, roller coating and the like which are conducted using a rotary coating machine. In addition, the coating thickness varies with different coating methods, concentrations of solid components in the composition and viscosities and the like, generally, the film thickness of the dried film is 0.1-10 μm.

The substrate coated with the positivephotosensitive resin composition is dried to obtain a photosensitive resin composition film. Preferably, in the process of drying, pre-drying is performed within a range of 50° C-180° C. using an oven, a hot plate or infrared ray.

A mask with a required pattern is put on the photosensitive resin composition film and then irradiated with chemical rays to be exposed. The chemical rays used when exposure include ultraviolet light, visible light, electron beam and X-ray. Preferably, the chemical rays select i line (365 nm), h line (405 nm) and g line (436 nm) of a mercury lamp.

After exposure, the exposed part is removed using a developing solution to form the pattern of the resin. The developing solution is a compound aqueous solution exhibiting alkalinity, such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylamine, dimethylaminoethyl acetate, dimethylaminoethanol, dimethylaminoethyl methacrylate, cyclohexylamine, ethylenediamine and hexanediamine. In addition, according to actual demands, N-methyl-2-pyrrolidone, N,N-dimethylformamide, N,N-dimethylacetamide, dimethyl sulfoxide γ-butyrolactone, dimethylacrylamide, methanol, ethanol, isopropanol, ethyl lactate, propylene glycol monomethyl ether acetate, cyclopentanone, cyclohexanone, isobutyl ketone or methyl isobutyl ketone can be alone or in combination added in these alkaline compound aqueous solutions. After developing, the resin is rinsed with water. The resin of the present disclosure and the solvent are prepared into varnish, and then the diazonaphthoquinone compound is added. The obtained photosensitive resin film is hardly dissolved into the alkaline developing solution before exposure, and can be dissolved into the alkaline developing solution after exposure.

After developing and rising, the resin is heated to 180° C-500° C. so that the photosensitive resin composition is transformed into the photosensitive resin film. The heating process can be selected temperature heat treatment, segmented heating heat treatment or heat treatment for 5 min-5 h with continuous heating at a selected temperature range.

The present disclosure also discloses use of the positive photosensitive resin composition. The resin film formed by the positive photosensitive resin composition can be applied to semiconductor passivation films, semiconductor element protective films, insulating layers of electroluminescent (EL) elements, flat films of thin film transistor (TFT) substrates for driving display devices using organic EL elements, wiring protective insulating films of circuit substrates and flat films for display and solid-state camera elements.

The present disclosure has the beneficial effects:

The present disclosure provides a resin with a novel structure. The resin contains a thiazole structure unit. The resin together with the diazonaphthoquinone compound is prepared into the positive photosensitive resin composition, and the photosensitive resin film prepared from the positive photosensitive resin composition has the characteristics of low shrinkage rate and excellent heat resistance and resolving power, and can be used for preparing the stable high-resolution pattern.

The resin film formed by the positive photosensitive resin composition of the presentdisclosure can be used as a semiconductor passivation film, a semiconductor element protective film, an insulating layer in a display device loaded with organic filed electroluminescent elements and the like, and can be suitable for a light crystal display (LCD), an electron capture detector (ECD), an electroluminescent display (ELD), a display device (organic filed electroluminescent device) loaded with organic filed electroluminescent elements, etc. The so-called organic filed electroluminescent device refers to a display device consisting of organic filed electroluminescent elements comprising a first electrode which is formed on a substrate, a film layer which is formed on the first electrode and comprises a luminescent layer formed at least by organic compounds and a second electrode which is formed on the film layer.

DETAILED DESCRIPTION OF THE EMBODIMENTS

Next, the specific embodiments of the present disclosure will be described in detail. The present disclosure can be implemented in many other modes different from the description here, similar improvements can be made by those skilled in the art without departing from the content of the present disclosure, and therefore the present disclosure is not limited by the disclosed specific embodiments.

Unless otherwise defined, the meaning of all the technical and scientific terminologies used herein is the same as that commonly understood by those skilled in the art. The used terms are only for the purpose of describing specific embodiments but not limiting the present disclosure.

(I) Synthesis of Monomer Compounds

Synthesis Example 1

Figure 1:
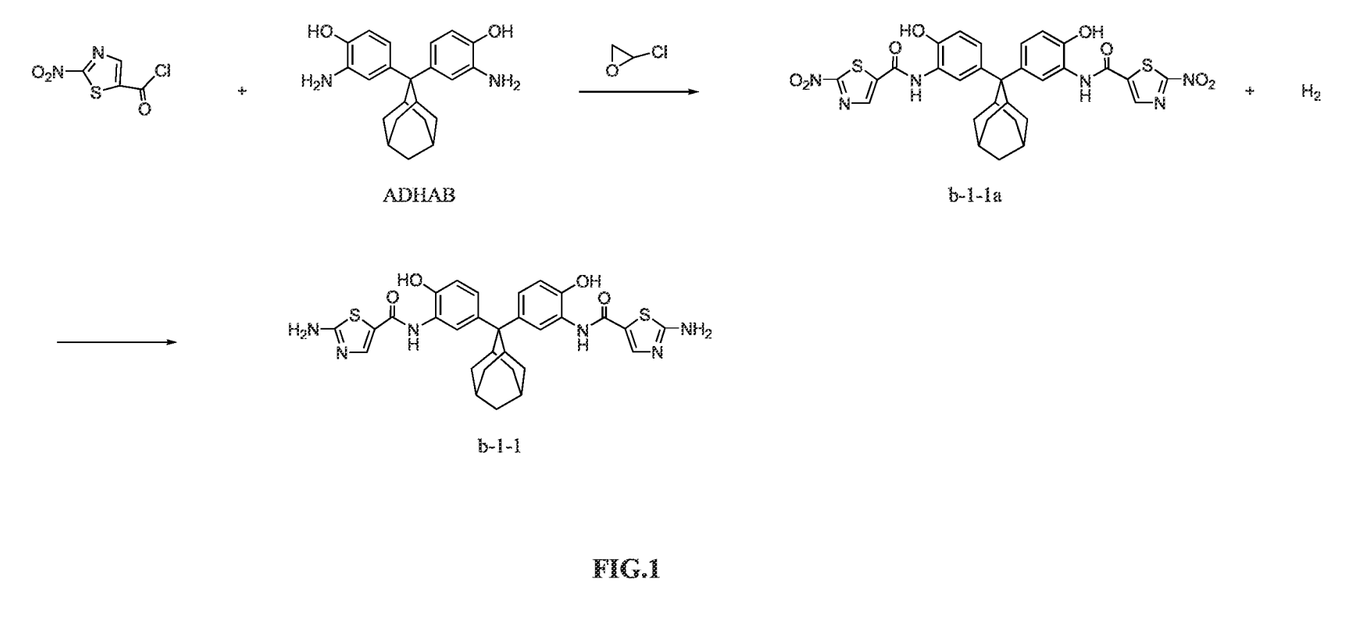
FIG. 1 is a synthesis route diagram of a synthesis example 1.

Diamine compound b-1-1 was synthesized according to the synthesis route as shown in FIG. 1.

(1) Synthesis of Compound b-1-1a

To a 500 mL three-necked round bottom flask were added ADHAB (35.02 g, 100 mmol), 1,2-epoxypropane (15.60 g, 200 mmol) and 250 ml of ethyl acetate, the reaction system was cooled to −10 to 0° C., at this moment, a solution of 2-nitro-5-formylchlorothiazole (40.43 g, 210 mmol) and 100 ml of ethyl acetate was dropwise added into the reaction system for the duration of 2 h, the reaction was carried out for 5 h at the temperature of −10 to 0° C., then heated to 20-30° C., stirred and preserved for 0.5 h and filtered, the obtained filter cake was crystallized with a tetrahydrofuran/ethanol (volume ratio 2:3) mixed solvent to obtain 58.27 g of yellow solid with a yield of 88%. The product was tested by high resolution mass spectrometry. By M/Z=662.13, it is confirmed that the product is the target product b-1-1a.

(2) Synthesis of Compound b-1-1

To a 1 L autoclave were added the obtained compound b-1-1a (33.11g, 50 mmol), 10% palladium carbon (1.6g, 70% water, 30% solid) and 400g of tetrahydrofuran, the autoclave was closed, hydrogen replacement was conducted for 3-5 times, then the autoclave was pressurized to 1.5-2 MPa with hydrogen, and the above materials reacted at 50-60° C. under the stirring. After the reaction was ended, a catalyst was removed by filtration, then a filtrate was subjected to desolvent, the obtained solid was added into a mixed solvent of 40 g of ethanol and 40 g of ethyl acetate and stirred for 30 minutes, and after filtration and drying, the solid compound b-1-1 was obtained, with a yield of 85%.

The high resolution massspectrum of the compound b-1-1: ESI source, positive ion mode, theoretical value 602.18, test value 602.20. Element analysis ($C_{30}H_{30}O_4N_6S_2$): theoretical value C:59.78, H:5.02, N:13.94, O:10.62, S:10.64; measured value C:59.77, H:5.00, N:13.96, O:10.65, S:10.62.

Synthesis Example 2

Synthesis of Diamine Compound b-1-2

In this synthesis example, the preparation method is the same as that of synthesis example 1, and the parent raw material is the same as that in synthesis example 1 (see Table 1). The difference is that 2-nitro-5-formylchlorothiazole in synthesis example 1 is replaced with 2-nitro-4-formylchlorothiazole.

Synthesis Example 3

Synthesis of Diamine Compound b-1-3

In this synthesis example, the preparation method is the same as that of synthesis example 1. The difference is that the raw material ADHAB in synthesis example 1 is replaced with a parent raw material in Table 1.

Synthesis Example 4

Synthesis of Diamine Compound b-1-4

In this synthesis example, the preparation method is the same as that of synthesis example 1. The difference is that the raw material ADHAB in synthesis example 1 is replaced with a parent raw material in Table 1, and 2-nitro-5-formylchlorothiazole in synthesis example 1 is replaced with 2-nitro-4-formylchlorothiazole.

The high resolution mass spectrum results, element analysis results, synthesis yields and synthesis parent raw material structure formulas of the diamine compounds b-1-2 to b-1-4 prepared in synthesis examples 2-4 are seen in Table 1 below:

TABLE 1

Characteristic data, yields and parent raw material structure formulas of compounds prepared in synthesis examples 2-4

| Synthesis example | Compound | Measured data for high resolution mass spectrum | Measured data for element analysis | Yield | Structural formula of parent raw material |
|---|---|---|---|---|---|
| 2 | b-1-2 | $C_{30}H_{30}O_4N_6S_2$ M/Z = 602.16 | C: 59.68, H: 5.04, N: 13.92, O: 10.65, S: 10.71 | 78.2 | |

TABLE 1-continued

Characteristic data, yields and parent raw material structure formulas of compounds prepared in synthesis examples 2-4

| Synthesis example | Compound | Measured data for high resolution mass spectrum | Measured data for element analysis | Yield | Structural formula of parent raw material |
|---|---|---|---|---|---|
| 3 | b-1-3 | $C_{23}H_{16}O_4F_6N_6S_2$<br>M/Z = 618.11 | C: 44.69,<br>H: 2.62,<br>N: 13.61,<br>O: 10.32,<br>S: 10.37,<br>F: 18.39 | 79.5 | (structure with HO, OH, H₂N, NH₂, F₃C, CF₃ groups on bis-phenyl hexafluoropropane) |
| 4 | b-1-4 | $C_{23}H_{16}O_4F_6N_6S_2$<br>M/Z = 618.09 | C: 44.63,<br>H: 2.63,<br>N: 13.58,<br>O: 10.37,<br>S: 10.38,<br>F: 18.41 | 85.2 | (structure with HO, OH, H₂N, NH₂, F₃C, CF₃ groups on bis-phenyl hexafluoropropane) |

Synthesis Example 5

Figure 2:
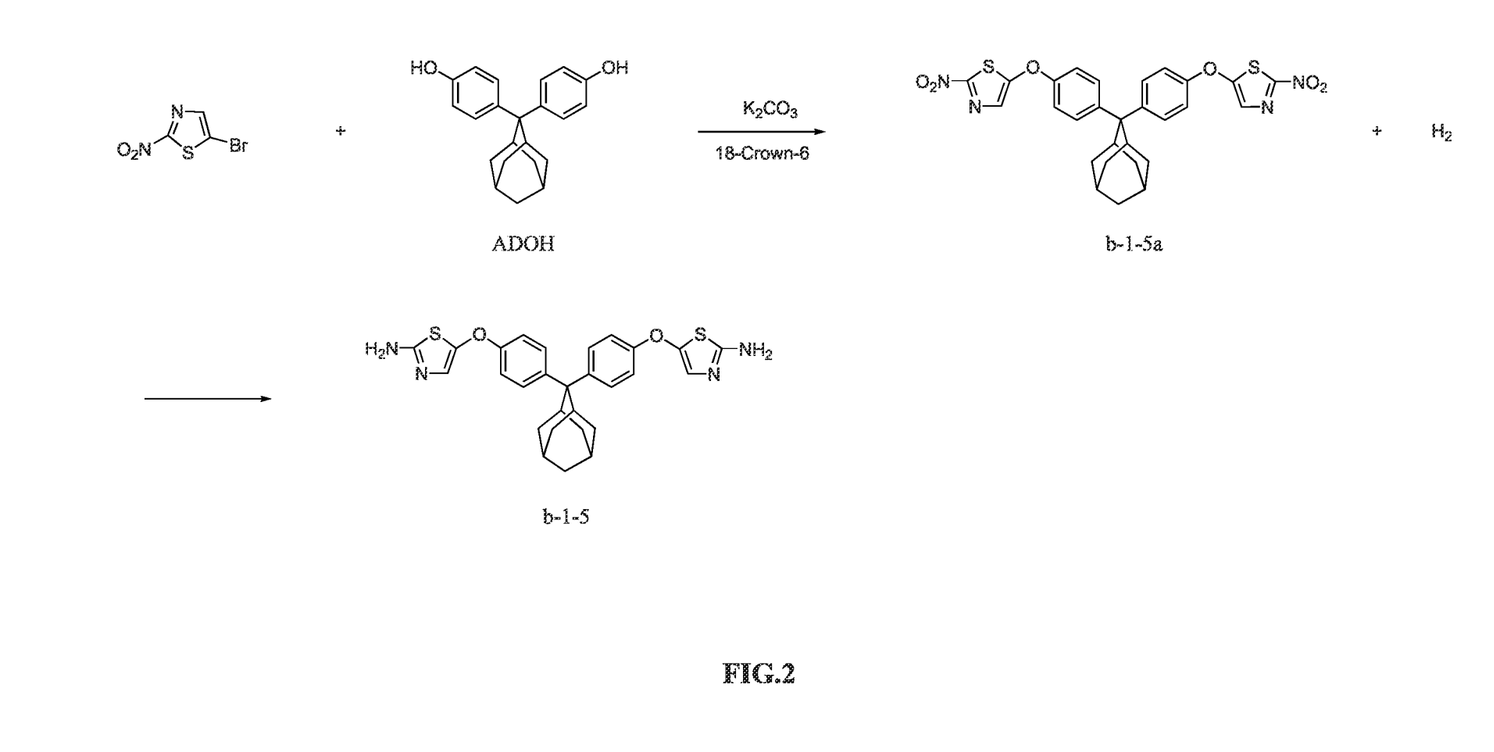
FIG. 2 is a synthesis route diagram of a synthesis example 5.

Diamine compound b-1-5 was synthesized according to the synthesis route as shown in FIG. 2.

(1) Synthesis of Compound b-1-5a

To a 500 mL three-necked round bottom flask were added ADOH (32.20 g, 100 mmol), potassium carbonate (33.10 g, 240 mmol), 18-crown-6 ether (2 g) and 250 ml of DMAC, the reaction system was cooled to −10 to 0° C., at this moment, a solution of 2-nitro-5-bromothiazole (43.66 g, 210 mmol) and 100 ml of DMAC was dropwise added into the reaction system for the duration of 2 h, the reaction was carried out for 5 h at the temperature of −10 to 0° C., then heated to 20-30° C., stirred and preserved for 0.5 h, and filtered, to obtain 50.17 g of light yellow solid, with a yield of 87%. The product was tested by high resolution mass spectrometry. By M/Z=576.22, it is confirmed that the product is the target product b-1-5a.

(2) Synthesis of Compound b-1-5

To a 1 L autoclave were added the obtained compound b-1-5a (28.81 g, 50 mmol), 10% palladium carbon (2 g, 70% water, 30% solid) and 400 g of tetrahydrofuran, the autoclave was closed, hydrogen replacement was conducted for 3-5 times, then the autoclave was pressurized to 1.5-2 MPa with hydrogen, and the above materials reacted at 50-60° C. under the stirring. After the reaction was ended, a catalyst was removed by filtration, then a filtrate was subjected to desolvent, and after filtration and drying, the solid compound b-1-5 was obtained, with a yield of 75%.

The high resolution massspectrum of the compound b-1-5: ESI source, positive ion mode, theoretical value 516.17, test value 516.20. element analysis ($C_{28}H_{28}O_2N_4S_2$): theoretical value C:65.09, H:5.46, N:10.84, O:6.19, S:12.41; measured value C:65.11, H:5.39, N:10.80, O:6.23, S:12.47.

Synthesis Example 6

In this example, the preparation method is the same as that of synthesis example 5, and the parent raw material is the same as that in synthesis example 5. The difference is that 2-nitro-5-bromothiazole in synthesis example 5 is replaced with 2-nitro-4-bromothiazole.

Synthesis Example 7

Synthesis of Diamine Compound b-1-7

In this synthesis example, the preparation method is the same as that of synthesis example 5. The difference is that the raw material ADOH in synthesis example 5 is replaced with a parent raw material in Table 2.

Synthesis Example 8

Synthesis of Diamine Compound b-1-8

In this synthesis example, the preparation method is the same as that of synthesis example 5. The difference is that the raw material ADOH in synthesis example 5 is replaced with a parent raw material in Table 2, and 2-nitro-5-bromothiazole in synthesis example 5 is replaced with 2-nitro-4-bromothiazole.

The high resolution mass spectrum results, element analysis results, synthesis yields and synthesis parent raw material structure formulas of the diamine compounds b-1-6 to b-1-8 prepared in synthesis examples 6-8 are seen in Table 2 below:

TABLE 2

Characteristic data, yields and parent raw material structure formulas of compounds prepared in synthesis examples 6-8

| Synthesis example | Compound | Measured data for high resolution mass spectrum | Measured data for element analysis | Yield | Structural formula of parent raw material |
|---|---|---|---|---|---|
| 6 | b-1-6 | $C_{28}H_{28}O_2N_4S_2$ M/Z = 516.19 | C: 65.14, H: 5.49, N: 10.79, O: 6.28, S: 12.30 | 79.8 | |
| 7 | b-1-7 | $C_{21}H_{14}O_2F_6N_4S_2$ M/Z = 532.08 | C: 47.41, H: 2.68, N: 10.55, O: 6.05, S: 12.04, F: 21.27 | 76.6 | |
| 8 | b-1-8 | $C_{21}H_{14}O_2F_6N_4S_2$ M/Z = 532.10 | C: 47.38, H: 2.62, N: 10.61, O: 6.02, S: 12.05, F: 21.32 | 84.5 | |

(II) Synthesis of Resin

Synthesis Example 9

Synthesis of Organic Solvent Soluble Polyimide (A-1-1)

The diamine compound b-1-1 (51.187 g, 85 mmol) and a capping agent 3-aminophenol (3.275g, 30 mmol) were dissolved into 796.167 g of N-methyl-2-pyrrolidone (hereinafter, called NMP for short), then dianhydride compound 3,3',4,4'-diphenylether tetracarboxylic dianhydride (31.001 g, 0.1 mole, hereinafter called ODPA for short) was added, the above raw materials reacted for 24 h in a 1000 ml three necked bottle at room temperature, subsequently the reaction solution was heated to 80° C., 17.865 g (150 mmol) of N, N'-dimethylformamide dimethyl acetal was dropwise added for the duration of 0.5 h, the reaction was preserved for 0.5 h followed by dropwise adding 24.008 g (40 mmol) of acetic acid to acidify for 0.5 h.

The solution was added into 2.5 L of pure water and the filtered, a filter cake was dried for 36 h in a vacuum drying oven at 80° C. to prepare powdered organic solvent soluble polymer resin A-1-1.

Synthesis Example 10-Synthesis Example 16

Resin A-1-2 to resin A-1-8 were prepared in synthesis example 10-synthesis example 16. In these synthesis examples, the method is the same as that in synthesis example 9, and the difference is that types of diamine, capping agent and dianhydride used are different, see Table 3.

Comparative synthesis example 1-comparative synthesis example 5

Resin A-2-1 to resin A-2-5 were prepared in comparative synthesis example 1-comparative synthesis example 5. In these comparative synthesis examples, the method is the same as that in synthesis example 9, and the difference is that types of diamine, capping agent and dianhydride used are different, see Table 4.

a-1: ODPA
a-2: 3,3',4,4'-biphenyltetracarboxylic dianhydride
a-3: 3,3',4,4'- benzophenone tetracarboxylic dianhydride
b-2-1: bis(3-amino-4-hydroxyphenyl) hexafluoropropane
b-2-2: bis(3-amino-4-hydroxyphenyl) methane
b-2-3:

b-2-4:

c-1:

c-2:

c-3: phthalic anhydride

TABLE 3

Types and amounts of monomers for synthesis of resins in synthesis examples 10-16

| Synthesis example | Polymer | Dianhydride (mole fraction) | Dianhydride (mole fraction) | Terminating agent (mole fraction) |
|---|---|---|---|---|
| 10 | A-1-2 | a-1 (100 fractions) | b-1-2 (70 fractions) b-2-1 (10 fractions) | c-1 (40 fractions) |
| 11 | A-1-3 | a-1 (70 fractions) a-3 (30 fractions) | b-1-3 (25 fractions) b-1-6 (30 fractions) b-2-4 (25 fractions) | c-2 (40-fractions) |
| 12 | A-1-4 | a-1 (75 fractions) a-2 (25 fractions) | b-1-4 (50 fractions) b-1-8 (30 fractions) b-2-3 (20 fractions) | 0 |
| 13 | A-1-5 | a-2 (100 fractions) | b-1-5 (25 fractions) b-1-7 (35 fractions) b-2-1 (25 fractions) | c-2 (30 fractions) |
| 14 | A-1-6 | a-2 (50 fractions) a-3 (50 fractions) | b-1-2 (50 fractions) b-2-4 (35 fractions) | c-1 (30-fractions) |
| 15 | A-1-7 | a-3 (100 fractions) | b-1-4 (80 fractions) b-2-2 (10 fractions) | c-1 (20 fractions) |
| 16 | A-1-8 | a-2 (50 fractions) a-3 (40 fractions) | b-1-2 (50 fractions) b-2-4 (50 fractions) | c-3 (30-fractions) |

TABLE 4

Types and amounts of monomers used for synthesis of resins in comparative synthesis examples 1-5

| Comparative synthesis example | Polymer | Dianhydride (mole fraction) | Dianhydride (mole fraction) | Terminating agent (mole fraction) |
|---|---|---|---|---|
| 1 | A-2-1 | a-1 (100 fractions) | b-2-4 (85 fractions) | c-1 (30 fractions) |
| 2 | A-2-2 | a-1 (70 fractions) a-3 (30 fractions) | b-2-1 (25 fractions) b-2-3 (30 fractions) b-2-4 (25 fractions) | c-2 (40-fractions) |
| 3 | A-2-3 | a-1 (75 fractions) a-2 (25 fractions) | b-2-3 (100 fractions) | 0 |
| 4 | A-2-4 | a-2 (100 fractions) | b-2-1 (80 fractions) b-2-2 (10 fractions) | c-1 (20 fractions) |
| 5 | A-2-5 | a-2 (50 fractions) a-3 (40 fractions) | b-2-1 (50 fractions) b-2-4 (50 fractions) | c-3 (20 fractions) |

(III) Application Example of Positivephotosensitive Resin Composition

The abbreviate of a compound used in application example is as follows:

B-1: Backborn:

DNQ (D):

DNQ/Backborn=2.5; Mono/Di/Tri=3/28/69.

B-2: Backborn:

DNQ (D):

DNQ/Backborn=2.3; Mono/Di/Tri=6/35/59.

C-1:

C-2:

GBL: γ-butyrolactone.
NMP: N-methylpyrrolidone.
PGME: propylene glycol monomethyl ether.

Application Example 1

Under yellow light, 10 g of A-1-1 of resin was dissolved into 100 g of N-methylpyrrolidone (NMP) and stirred at room temperature to be completely dissolved, 1.5 g of B-1 and 1 g of C-1 were added and stirred to be completely dissolved, and the obtained mixture stood for 12 hours and filtered to prepare a positive photosensitive resin composition.

Application Example 2-Application Example 5

In application example 2-application example 5, the positive photosensitive resin compositions were prepared by using the same method as that in application example 1. The difference is that the used resin, diazonaphthoquinone compound and cross-linking agent are different, as shown in Table 5.

Comparative Example 1-Comparative Example 4

In comparative example 1-comparative example 4, the positive photosensitive resin compositions were prepared by using the same method as that in application example 1. The difference is that the used resin, diazonaphthoquinone compound and cross-linking agent are different, as shown in Table 6.

TABLE 5

Raw material proportion data of positive photosensitive resin compositions in application examples 2-5

| Application example | Resin (g) | Diazonaphtho-quinone (g) | Cross-linking agent (g) | Solvent (g) |
|---|---|---|---|---|
| 2 | A-1-3 (10) | B-1 (1.8) B-2 (0.4) | C-1 (1.8) | PGME (45) GBL (50) NMP (5) |
| 3 | A-1-4 (10) | B-1 (1.0) B-2 (0.3) | C-2 (1.2) | NMP (50) PGME (50) |

TABLE 5-continued

Raw material proportion data of positive photosensitive resin compositions in application examples 2-5

| Application example | Resin (g) | Diazonaphtho-quinone (g) | Cross-linking agent (g) | Solvent (g) |
|---|---|---|---|---|
| 4 | A-1-3 (10) | B-1 (1.5) | C-2 (1.2) | GBL (100) |
| 5 | A-1-7 (10) | B-2 (1.7) | C-1 (1.6) | NMP (100) |
| 6 | A-1-8 (10) | B-2 (2.0) | C-2 (1.5) | NMP (50) PGME (50) |

TABLE 6

Raw material proportion data of positive photosensitive resin compositions in comparative examples 1-4

| Comparison example | Polymer (g) | Diazonaphtho-quinone (g) | Cross-linking agent (g) | Solvent (g) |
|---|---|---|---|---|
| 1 | A-2-1 (10) | B-1 (1.5) | C-1 (2.0) | NMP (100) |
| 2 | A-2-2 (10) | B-1 (1.8) B-2 (0.4) | C-1 (1.8) | PGME (45) GBL (50) NMP (5) |
| 3 | A-2-3 (10) | B-1 (1.0) B-2 (0.3) | C-2 (1.2) | NMP (50) PGME (50) |
| 4 | A-2-4 (10) | B-2 (1.7) | C-1 (1.6) | NMP (100) |
| 5 | A-2-5 (10) | B-2 (2.0) | C-2 (1.5) | NMP (50) PGME (50) |

The performance of the positive photosensitive resin composition is evaluated. The evaluation standard and specific operations are as follows:

I. Preparation of Photosensitive Resin Film

The photosensitive resin composition (hereinafter referred to as varnish) was coated on to a 6-inch silicon plate, so that the thickness of the film after pre-baking was 2 μm. Then, a hot plate (Suzhou Meitu Semiconductor Co., Ltd. model SPHP-8) was used to pre-bake at 120° C. for 3 minutes to prepare the photosensitive resin film.

II. Measurement Method of Film Thickness

The thickness of the photosensitive resin film was measured using DektaXT step profiler manufactured from Bruker.

III. Exposure

An exposure machine (Model H94-25C from Sichuan Nanguang Technology Co., Ltd.) was equipped with measurement mask patterns to perform full-wavelength ultraviolet exposure within a specified time at an ultraviolet ray intensity of 13 mW/cm$^2$ (which is converted into a light intensity at a 365 nm wavelength).

IV. Developing

A developing solution consisting of 2.38% tetramethylammonium hydroxide aqueous solution was used to soak for 60 seconds at 23° C. for developing. Then, drying was conducted subsequent to rinsing for 60 seconds with water.

V. Calculation of Shrinkage Rate

The thickness of the film after pre-baking was measured after the silicon plate coated with varnish was pre-baked (120° C., 180S), the resin film on the silicon plate was subjected to primary curing, heated to 250° C. by virtue of a hot plate and dried for 60 min, cooled to 50° C., and then the thickness of the film after primary curing was measured.

The shrinkage rate is calculated based on the following formula:

Shrinkage rate (%)=(film thickness after pre-baking−film thickness after primary curing)÷film thickness after pre baking×100%

VI. Calculation of Resolving Power

The size of the minimum pattern under the optimal exposure after exposure and developing is called resolving power.

VII. Calculation of Heat Resistance

The 5% thermal weight loss temperature (Td5) of the primarily cured sample and was measured with a thermogravimetric analyzer (TGA METTLER).

The positive photosensitive resin compositions prepared in application examples 1-6 and comparative examples 1-7 were tested and evaluated according to evaluation standard. The test results are seen in Table 7.

TABLE 7

| | Evaluation results | | |
|---|---|---|---|
| Number | Resolving power (μm) | Shrinkage rate (%) | Td$_5$ |
| Application example 1 | 4 | 12 | 378 |
| Application example 2 | 4 | 14 | 365 |
| Application example 3 | 6 | 14 | 370 |
| Application example 4 | 8 | 12 | 368 |
| Application example 5 | 8 | 11 | 377 |
| Application example 6 | 4 | 10 | 372 |
| Comparison example 1 | 16 | 26 | 315 |
| Comparison example 2 | 18 | 23 | 305 |
| Comparison example 3 | 20 | 27 | 312 |
| Comparison example 4 | 18 | 23 | 315 |
| Comparison example 5 | 22 | 26 | 305 |

It can be seen from Table 7 that the photosensitive resin composition prepared by using the technical solution of the present disclosure has the characteristics of low shrinkage rate and excellent heat resistance and resolving power, and the stable high resolution pattern can be made. The resin structures of the positive photosensitive resin compositions prepared in comparative examples 1-4 have no thiazole structures, and the resolving power and shrinkage rate performance data of the positive photosensitive resin compositions prepared in comparative examples 1-4 are obviously not superior to those in application examples 1-6, illustrating that the thiazole structure in the resin of the present disclosure is conducive to improving the application performance of the positive photosensitive resin composition.

The positive photosensitive resin composition of the presentdisclosure is applicable to an interlayer insulating film, a passivation film, a buffer coating film of a semiconductor component, and an insulating film for a multilayer printed substrate, etc., and also can be used as a protective film of a film transistor of a liquid crystal display element, an electrode protective film of an organic EL component, etc.

The various technical features of the embodiments can be combined at random. For simplifying the description, all possible combinations of various technical features in the above embodiments are not exhaustive. However, as long as there is no contradiction in the combination of these technical features, it should be considered as the scope of the specification.

What is claimed is:

1. A positive photosensitive resin composition, comprising a resin, a diazonaphthoquinone compound and a solvent, wherein the resin is a combination of any one or more of polyamic acid, polyamic ester and polyimide of a segment shown in formula (1);

formula (1)

in the formula (1), X represents a tetravalent organic group; $R_1$ is a hydrogen atom or a C1-10 organic group; Y represents a bivalent organic group constituting the resin, and at least comprises a general structure formula (2):

formula (2)

in the formula (2), Y1 is any one of:

and and * represents a linkage position;
$R_2$ in the formula (2) is selected from —NHCO— or —O—;

n in the formula (1) is an integer in a range of 10-100000;

the organic group in the formula (2) is derived from one or more of the following diamine b-1-1 to b-1-8:

b-1-1 b-1-2 b-1-3 b-1-4 b-1-5 b-1-6 b-1-7 b-1-8 a weight ratio of the resin to the solvent is 1:(5-80); a weight ratio of the resin to the diazonaphthoquinone compound is 100:(1-100).

2. The positive photosensitive resin composition according to claim 1, wherein at least one tail end of the formula (1) has a terminated structure of formula (3) or formula (4):

formula (3)

formula (4)

in the formula (3), M is derived from a monoamine group which is selected from aniline, n-butylamine, n-pentamine, n-hexanamine, n-heptylamine, n-octylamine, 2-aminothiazole, aminoquinoline, p-aminophenol, and 3-aminophenol; in the formula (4), L is derived from a monoanhydride group which is selected from maleic anhydride, naphthalene dicarboxylic anhydride, phthalic anhydride or cyclopentane dicarboxylic anhydride.

3. The positive photosensitive resin composition according to claim 1, wherein the formula (1) further comprises a diamine residue except formula (2), the diamine residue is derived from a combination of one or more of the following diamine monomers: p-phenylenediamine, m-phenylenediamine, 3-carboxyl-m-phenylenediamine, 4,4'-diaminodiphenyl ether, 3,4'-diaminodiphenyl ether, 3,4-diaminodiphenyl sulfone, 4,4'-diaminodiphenyl sulfone, 3,4'-diaminodiphenyl sulfide, 4,4'-diaminodiphenyl sulfide, 1,4-di(4-aminophenoxy) benzene, di(4-aminophenoxy phenyl) sulfone, di(3-aminophenoxy phenyl) sulfone, bis(3-amino-4-hydroxy) biphenyl, 3,4'-diaminodiphenylmethane, 4,4'-diaminodiphenylmethane, 3,3'-dimethyl-4,4'-diaminobiphenyl, 2,2'-dimethyl-4,4'-diaminobiphenyl, 2,2'-bis (trifluoromethyl)-4,4'-diaminobiphenyl, 2,2,3,3'-tetramethyl-4,4'-diaminobiphenyl, 3,3',4,4'-tetramethyl-4,4'-diaminobiphenyl, 2,2'-bis [3-(4-amino-benzamido)-4-hydroxyphenyl]hexafluoropropane and 3,3'-dihydroxy bis [4-(4-amino-benzamido)]biphenyl.

4. The positive photosensitive resin composition according to claim 1, wherein the tetracarboxylic acid residuerepresented by X in the formula (1) is derived from a combination of one or more of the following dianhydride monomers: pyromellitic dianhydride, 3,3',4,4'-biphenyltetracarboxylic dianhydride, 3,3',4,4'-diphenylether tetracarboxylic dianhydride, 3,3',4,4'-diphenylsulfone tetracarboxylic dianhydride, 3,3',4,4'-benzophenone tetracarboxylic dianhydride, 2,2-bis(3,4-dicarboxyphenyl) hexafluoroisopropylidene dianhydride, 1,2,3,4-cyclobutane tetracarboxylic dianhydride, 1,2-dimethyl-1,2,3,4-cyclobutane tetracarboxylic dianhydride, 1,2,3,4-tetramethyl-1,2,4-tetramethyl-1,2,4-tetramethyl-1,2,4-tetracarboxylic dianhydride 3,4-cyclobutane tetracarboxylic dianhydride 1,2,3,4-cyclopentane tetracarboxylic dianhydride, 1,2,4,5-cyclohexane tetracarboxylic dianhydride, 3,4-dicarboxy-1,2,3,4-tetrahydroxy- 1-naphthalenesuccinic dianhydride, 5-(2,5-dioxothetrahydrofuranyl)-3-methyl-3-cyclohexene-1,2-dicarboxylic dianhydride, 2,3,5-tricarboxy-2-cyclopentane acetic dianhydride, bicyclic[2.2.2]oct-7-en-2,3,5,6-tetracarboxylic dianhydride, 2,3,4,5-tetrahydrofuran tetracarboxylic dianhydride and 3,5,6-tricarboxyl-2-norbornene acetic dianhydride.

5. The positive photosensitive resin composition according to claim 4, wherein the carboxyl group in the formula (1) reacts with an adjacent amide group to be imidized, and an imidization rate is 1%-40%.

6. The positive photosensitive resin composition according to claim 1, wherein the diazonaphthoquinone compound is a 1,2-naphthaloquino-2-diazo-4-sulfonic acid ester compound or a 1,2-naphthaloquino-2-diazo-5-sulfonic acid ester compound; the esterification parent of the 1,2-naphthaloquino-2-diazo-4-sulfonic acid ester compound or the 1,2-naphthaloquino-2-diazo-5-sulfonic acid ester compound is a low-molecular-weight polyphenol compound.

7. The positive photosensitive resin composition according to claim 1, further comprising a cross-linking agent.

* * * * *